US008339301B2

(12) United States Patent
Na et al.

(10) Patent No.: US 8,339,301 B2
(45) Date of Patent: Dec. 25, 2012

(54) GAMMA VOLTAGE GENERATOR AND DAC HAVING GAMMA VOLTAGE GENERATOR

(75) Inventors: Joon Ho Na, Daejeon-si (KR); An Young Kim, Daejeon-si (KR); Yong Icc Jung, Incheon-si (KR); Soo Woo Kim, Daejeon-si (KR)

(73) Assignee: Silicon Works Co., Ltd., Daejeon-Si (KR)

( * ) Notice: Subject to any disclaimer, the term of this patent is extended or adjusted under 35 U.S.C. 154(b) by 168 days.

(21) Appl. No.: 13/002,750

(22) PCT Filed: Jun. 23, 2009

(86) PCT No.: PCT/KR2009/003350
§ 371 (c)(1),
(2), (4) Date: Jan. 5, 2011

(87) PCT Pub. No.: WO2010/005192
PCT Pub. Date: Jan. 14, 2010

(65) Prior Publication Data
US 2011/0133972 A1 Jun. 9, 2011

(30) Foreign Application Priority Data
Jul. 8, 2008 (KR) ........................ 10-2008-0066046

(51) Int. Cl.
*H03M 1/78* (2006.01)

(52) U.S. Cl. ........ 341/154; 341/144; 341/147; 341/148; 345/77; 345/87; 345/89; 345/98

(58) Field of Classification Search .................. 341/144, 341/147, 148, 154; 345/77, 87, 89, 98, 100, 345/204
See application file for complete search history.

(56) References Cited

U.S. PATENT DOCUMENTS 5,874,988 A * 2/1999 Gu .................................. 348/97
6,359,389 B1 * 3/2002 Medina et al. ............. 315/169.1
6,879,310 B2 * 4/2005 Nose .............................. 345/88
(Continued)

FOREIGN PATENT DOCUMENTS

KR 10-2003-0020832 A 3/2003
(Continued)

OTHER PUBLICATIONS

International Search Report, Appln No. PCT/KR2009/003350, dated Feb. 8, 2010.

(Continued)

*Primary Examiner* — Linh Nguyen
(74) *Attorney, Agent, or Firm* — Kile Park Goekjian Reed & McManus PLLC

(57) ABSTRACT

A gamma voltage generator includes an RGB common gamma voltage generation section configured to generate RGB common gamma voltages using corresponding gamma reference voltages among a plurality of gamma reference voltages; and at least two of an RG gamma voltage generation section configured to generate RG gamma voltages using corresponding gamma reference voltages among the plurality of gamma reference voltages, an R gamma voltage generation section configured to generate R gamma voltages using corresponding gamma reference voltages among the plurality of gamma reference voltages, a G gamma voltage generation section configured to generate G gamma voltages using corresponding gamma reference voltages among the plurality of gamma reference voltages, and a B gamma voltage generation section configured to generate B gamma voltages using corresponding gamma reference voltages among the plurality of gamma reference voltages.

15 Claims, 8 Drawing Sheets

U.S. PATENT DOCUMENTS

| | | | | |
|---|---|---|---|---|
| 6,884,839 | B1 * | 4/2005 | Bendix et al. | 524/570 |
| 7,095,395 | B2 * | 8/2006 | Bu | 345/89 |
| 7,176,913 | B2 * | 2/2007 | Yamada et al. | 345/213 |
| 7,379,081 | B2 * | 5/2008 | Park et al. | 345/690 |
| 7,764,212 | B2 * | 7/2010 | Lee et al. | 341/145 |
| 7,800,562 | B2 * | 9/2010 | Asano | 345/77 |
| 8,013,769 | B2 * | 9/2011 | Kim | 341/144 |
| 2003/0132906 | A1 * | 7/2003 | Tanaka et al. | 345/89 |
| 2005/0062691 | A1 * | 3/2005 | Tamura et al. | 345/76 |

FOREIGN PATENT DOCUMENTS

| | | | |
|---|---|---|---|
| KR | 10-2004-0034364 | A | 4/2004 |
| KR | 10-2005-0093824 | A | 9/2005 |
| KR | 10-2007-0078002 | A | 7/2007 |

OTHER PUBLICATIONS

Written Opinion of the International Searching Authority, Appln No. PCT/KR2009/003350, dated Feb. 8, 2010.

* cited by examiner

GAMMA VOLTAGE GENERATOR AND DAC HAVING GAMMA VOLTAGE GENERATOR

BACKGROUND OF THE INVENTION

1. Field of the Invention

The present invention relates to a gamma voltage generator, and more particularly, to a gamma voltage generator which can generate gamma voltages to be independently applied to RGB (red, green and blue) image signals and a digital-to-analog converter (DAC) having the same.

2. Description of the Related Art

In general, gamma correction is a task of correcting the different photoelectrical conversion characteristics and the nonlinearity of a camera and a receiver when converting light into electrical signals in the camera and reconverting the converted electrical signals into an image in the receiver. A mathematical expression applied when implementing the gamma correction can be shown as a curve, and this curve is called a gamma curve.

In order to implement gamma correction, a plurality of gamma voltages having predetermined voltage levels are set and used. Since the gamma voltages vary depending upon the characteristics of a display, the voltage levels of the gamma voltages should be controlled, which is called gamma control. The gamma control means that, when two data having different maximum luminances are normalized or tuned to be within the same range, a maximum luminance and a minimum luminance as two vertexes are maintained as they are and only the slopes of luminance curves are changed so that colors of intermediate tones become more dark or light. The gamma voltages are used in the gamma control.

FIG. 1 shows the transmittances of RGB image signals with respect to gray scale.

Referring to FIG. 1, the transmittances of red (R), green (G) and blue (B) image signals are different in a region (indicated by a dotted ellipse) where gray scale is large. This is because a gray voltage is commonly applied to all of the RGB image signals. The difference causes limitations in reproducing an original color.

FIG. 2 is a circuit diagram of a conventional gamma voltage generator.

Referring to FIG. 2, a gamma voltage generator 200 is realized by an array of a plurality of resistors which are connected in series between inputted gamma reference voltages having a plurality of voltage levels. The intermediate node vales of the array of resistors correspond to the gray scale shown in FIG. 1.

FIG. 3 is a block diagram illustrating a DAC for outputting gamma voltages corresponding to gamma voltage selection signals.

Referring to FIG. 3, a DAC 300 includes a gamma voltage generator 310 and a gamma voltage selection block 320.

The gamma voltage generator 310 generates gamma voltages having the number the same as to or less than $2^N$ (N is an integer), using inputted gamma reference voltages. The gamma voltage selection block 320 selects and outputs gamma voltages $V_G$ corresponding to N-bit gamma voltage selection signals D<0:N−1> among the $2^N$ number of gamma voltages.

As shown in FIG. 1, the transmittances of RGB image signals are different in the region (indicated by a dotted ellipse) where gray scale is large. In this regard, disadvantages are caused in that the gamma voltage generator 310 shown in FIG. 3, using the circuit shown in FIG. 2, cannot precisely control the differences.

SUMMARY OF THE INVENTION

Accordingly, the present invention has been made in an effort to solve the problems occurring in the related art, and an object of the present invention is to provide a gamma voltage generator which can generate gamma voltages to be independently applied to RGB image signals.

Another object of the present invention is to provide a digital-to-analog converter (DAC) which can output optimal gamma voltages using the gamma voltages generated by a gamma voltage generator for generating gamma voltages to be independently applied to RGB image signals.

In order to achieve the first object, according to one aspect of the present invention, there is provided a gamma voltage generator comprising an RGB common gamma voltage generation section; and at least two of an RG gamma voltage generation section, an R gamma voltage generation section, a G gamma voltage generation section, and a B gamma voltage generation section.

The RGB common gamma voltage generation section generates RGB common gamma voltages using corresponding gamma reference voltages among a plurality of gamma reference voltages. The RG gamma voltage generation section generates RG gamma voltages using corresponding gamma reference voltages among the plurality of gamma reference voltages. The R gamma voltage generation section generates R gamma voltages using corresponding gamma reference voltages among the plurality of gamma reference voltages. The G gamma voltage generation section generates G gamma voltages using corresponding gamma reference voltages among the plurality of gamma reference voltages. The B gamma voltage generation section generates B gamma voltages using corresponding gamma reference voltages among the plurality of gamma reference voltages.

In order to achieve the second object, according to another aspect of the present invention, there is provided a digital-to-analog converter comprising a gamma voltage generator, a control circuit and a switching block.

The gamma voltage generator generates at least three kinds among RGB common gamma voltages, RG gamma voltages, R gamma voltages, G gamma voltages and B gamma voltages, using gamma reference voltages. The control circuit generates at least three driving signals among an RGB driving signal, an RG driving signal, an R driving signal, a G driving signal and a B driving signal in response to an input control signal and a least significant bit of N-bit (N is an integer) gamma voltage selection signals. The switching block switches the RGB common gamma voltages, the RG gamma voltages, the R gamma voltages, the G gamma voltages and the B gamma voltages in response to at least three corresponding driving signals among the RGB driving signal, the RG driving signal, the R driving signal, the G driving signal and the B driving signal, and selects and outputs gamma voltages that correspond to bits remaining by excluding the least significant bit from the N-bit gamma voltage selection signals.

In order to achieve the second object, according to still another aspect of the present invention, there is provided a digital-to-analog converter comprising a gamma voltage generator, a control circuit and a switching block.

The gamma voltage generator generates at least three kinds among RGB common gamma voltages, RG gamma voltages, R gamma voltages, G gamma voltages and B gamma voltages, using gamma reference voltages. The control circuit generates at least two driving signals among an RG driving signal, an R driving signal, a G driving signal and a B driving signal in response to an input control signal. The switching block selects and outputs gamma voltages that correspond to N-bit gamma voltage selection signals, among the RGB common gamma voltages directly transmitted thereto, and the RG gamma voltages, the R gamma voltages, the G gamma voltages and the B gamma voltages received through switching in response to at least two driving signals among the RG driving signal, the R driving signal, the G driving signal and the B driving signal.

In order to achieve the second object, according to a still further aspect of the present invention, there is provided a digital-to-analog converter comprising a gamma voltage generator, a control circuit and a switching block.

The gamma voltage generator generates at least three kinds among RGB common gamma voltages, RG gamma voltages, R gamma voltages, G gamma voltages and B gamma voltages, using gamma reference voltages. The control circuit generates at least two driving signals among an RG driving signal, an R driving signal, a G driving signal and a B driving signal in response to an input control signal. The switching block selects and outputs gamma voltages that correspond to N-bit gamma voltage selection signals, among the RGB common gamma voltages, the RG gamma voltages, the R gamma voltages, the G gamma voltages and the B gamma voltages, in response to at least two driving signals among the RG driving signal, the R driving signal, the G driving signal and the B driving signal.

BRIEF DESCRIPTION OF THE DRAWINGS

The above objects, and other features and advantages of the present invention will become more apparent after a reading of the following detailed description taken in conjunction with the drawings, in which.

DETAILED DESCRIPTION OF PREFERRED EMBODIMENTS

Figure 1:
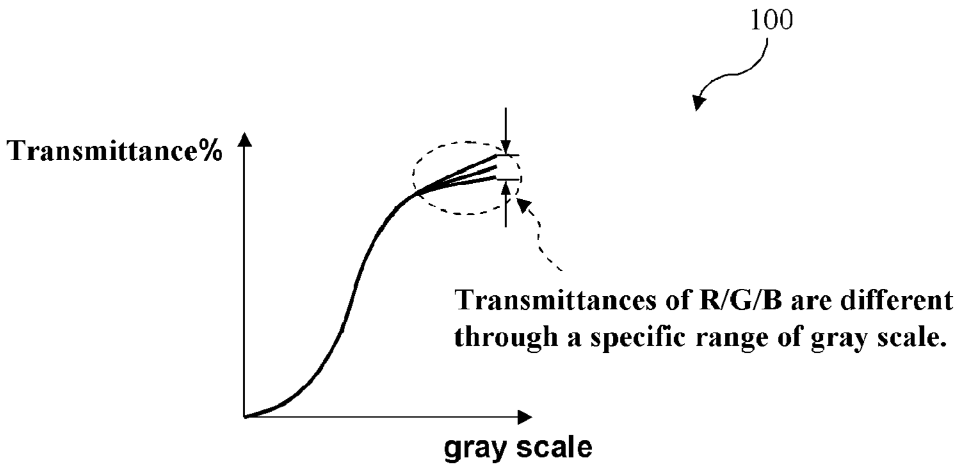
FIG. 1 shows the transmittances of RGB image signals with respect to gray scale.
Figure 2:
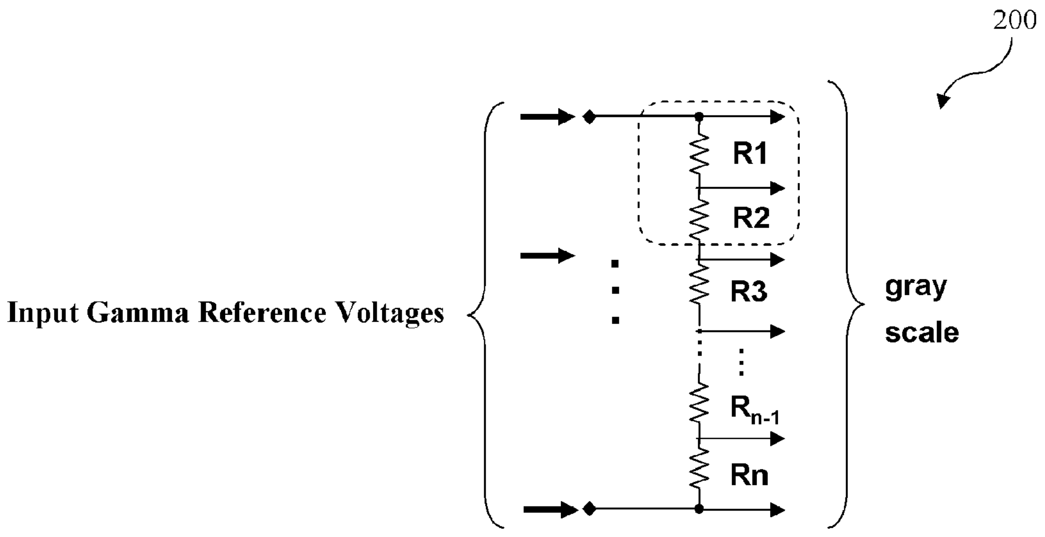
FIG. 2 is a circuit diagram of a conventional gamma voltage generator.
Figure 3:
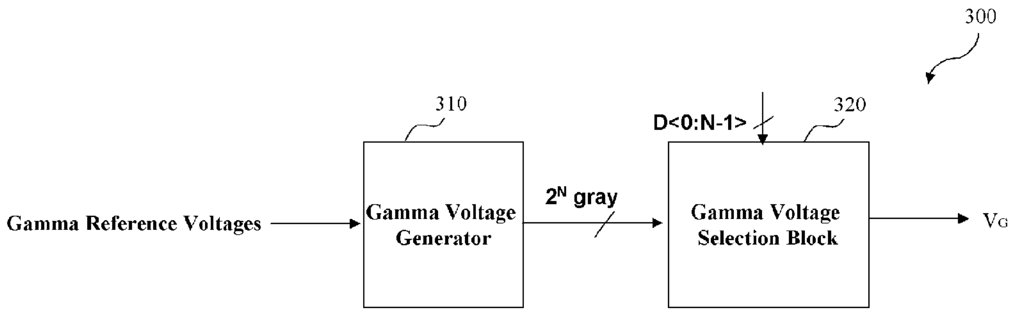
FIG. 3 is a block diagram illustrating a digital-to-analog converter (DAC) for outputting gamma voltages corresponding to gamma voltage selection signals.

Reference will now be made in greater detail to preferred embodiments of the invention, examples of which are illustrated in the accompanying drawings. Wherever possible, the same reference numerals will be used throughout the drawings and the description to refer to the same or like parts.

Figure 4:
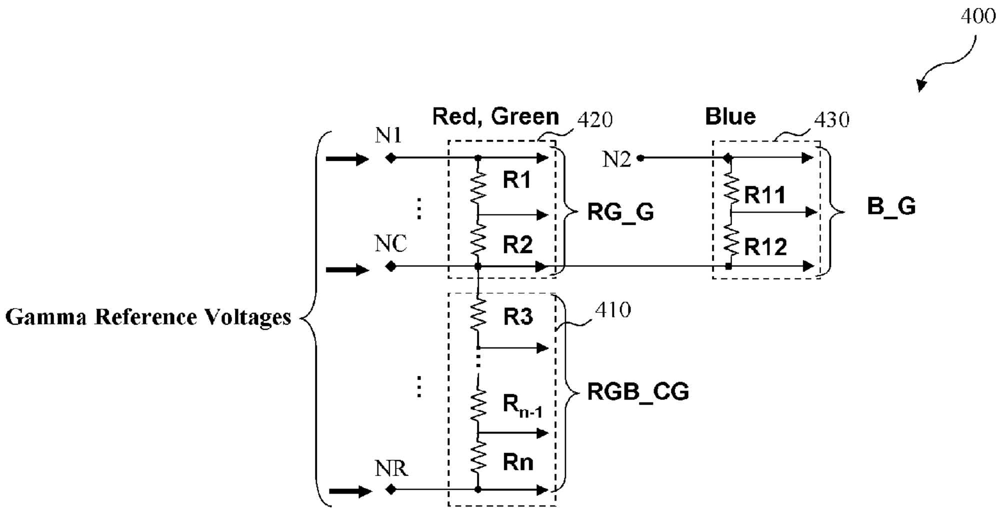
FIG. 4 is a view illustrating one embodiment of a gamma voltage generator for generating gamma voltages to be independently applied to RGB image signals according to the present invention.

FIG. 4 is a view illustrating one embodiment of a gamma voltage generator for generating gamma voltages to be independently applied to RGB image signals according to the present invention.

Referring to FIG. 4, a gamma voltage generator 400 includes an RGB common gamma voltage generation section 410, an RG gamma voltage generation section 420, and a B gamma voltage generation section 430.

The RGB common gamma voltage generation section 410 has a plurality of resistors R3 through Rn (n is an integer) which are connected in series between a reference node NR and a common node NC. Corresponding gamma reference voltages are applied to some of the nodes between the plurality of resistors connected in series, and RGB common gamma voltages RGB_CG are outputted from corresponding nodes among the nodes between the plurality of resistors connected in series.

The RG gamma voltage generation section 420 has a plurality of resistors R1 and R2 which are connected in series between the common node NC and a first node N1. Corresponding gamma reference voltages are applied to some of the nodes between the plurality of resistors connected in series, and RG gamma voltages RG_G are outputted from corresponding nodes among the nodes between the plurality of resistors connected in series.

The B gamma voltage generation section 430 has a plurality of resistors R11 and R12 which are connected in series between the common node NC and a second node N2. Corresponding gamma reference voltages are applied to some of the nodes between the plurality of resistors connected in series, and B gamma voltages B_G are outputted from corresponding nodes among the nodes between the plurality of resistors connected in series.

Among the gamma reference voltages, each of a lowest voltage and a highest voltage is exclusively applied to each one of the reference node NR and the first node N1. That is to say, if the highest voltage is applied to the reference node NR, the lowest voltage is applied to the first node N1, and if the lowest voltage is applied to the reference node NR, the highest voltage is applied to the first node N1. Accordingly, there are a case in which the highest voltage or a voltage higher or lower by a predetermined voltage level than the highest voltage is applied to the second node N2 and a case in which the lowest voltage or a voltage higher or lower by a predetermined voltage level than the lowest voltage is applied to the second node N2.

At this time, since a minimum luminance and a maximum luminance should be the same in R, G and B, in the case where the same gamma reference voltages are applied to the first node N1 and the second node N2, the resistance value of the resistor array R1 and R2 which generates the RG gamma voltages RG_G and the resistance value of the resistor array R11 and R12 which generates the B gamma voltages B_G are controlled to be different from each other. Even in the case where different gamma reference voltages are applied to the first node N1 and the second node N2, in order to make a minimum luminance and a maximum luminance the same in R, G and B, the resistance value of the resistor array R1 and R2 which generates the RG gamma voltages RG_G and the resistance value of the resistor array R11 and R12 which generates the B gamma voltages B_G should be controlled.

Referring to FIG. 4, while it was illustrated that the resistor array R1 and R2 includes two resistors R1 and R2 and the resistor array R11 and R12 includes two resistors R11 and R12, it is to be understood that each of the resistor arrays includes at least two resistors. The number of the RG gamma voltages RG_G and the number of the B gamma voltages B_G are the same, and therefore, the sum of the numbers of the RGB common gamma voltages RGB_CG and the RG gamma voltages RG_G and the sum of the numbers of the RGB common gamma voltages RGB_CG and the B gamma voltages B_G are less than or the same as $2^n$.

Figure 5:
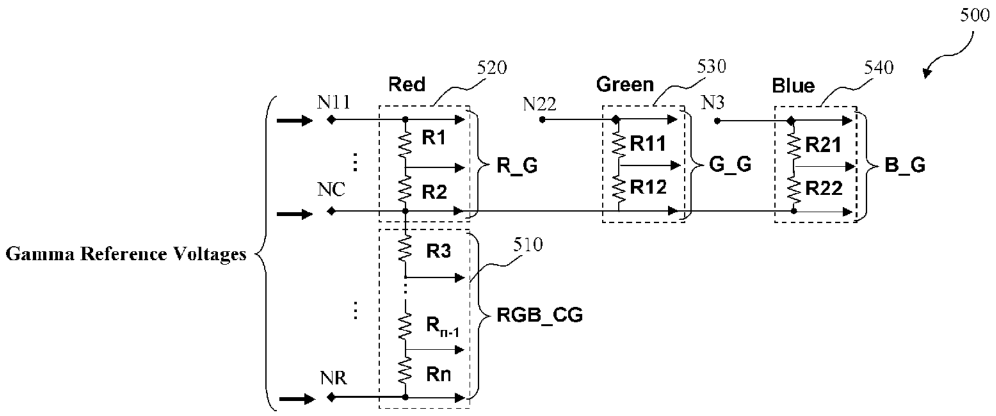
FIG. 5 is a view illustrating another embodiment of the gamma voltage generator for generating gamma voltages to be independently applied to RGB image signals according to the present invention.

FIG. 5 is a view illustrating another embodiment of the gamma voltage generator for generating gamma voltages to be independently applied to RGB image signals according to the present invention.

Referring to FIG. 5, a gamma voltage generator 500 includes an RGB common gamma voltage generation section 510, an R gamma voltage generation section 520, a G gamma voltage generation section 530, and a B gamma voltage generation section 540.

The RGB common gamma voltage generation section 510 has a plurality of resistors R3 through Rn which are connected in series between a reference node NR and a common node NC. Corresponding gamma reference voltages are applied to some of the nodes between the plurality of resistors connected in series, and RGB common gamma voltages RGB_CG are outputted from corresponding nodes among the nodes between the plurality of resistors connected in series.

The R gamma voltage generation section 520 has a plurality of resistors R1 and R2 which are connected in series between the common node NC and an eleventh node N11. Corresponding gamma reference voltages are applied to some of the nodes between the plurality of resistors connected in series, and R gamma voltages R_G are outputted from corresponding nodes among the nodes between the plurality of resistors connected in series.

The G gamma voltage generation section 530 has a plurality of resistors R11 and R12 which are connected in series between the common node NC and a twenty second node N22. Corresponding gamma reference voltages are applied to some of the nodes between the plurality of resistors connected in series, and G gamma voltages G_G are outputted from corresponding nodes among the nodes between the plurality of resistors connected in series.

The B gamma voltage generation section 540 has a plurality of resistors R21 and R22 which are connected in series between the common node NC and a third node N3. Corresponding gamma reference voltages are applied to some of the nodes between the plurality of resistors connected in series, and B gamma voltages B_G are outputted from corresponding nodes among the nodes between the plurality of resistors connected in series.

In the same manner as described above with reference to FIG. 4, among the gamma reference voltages, each of a lowest voltage and a highest voltage is exclusively applied to each one of the reference node NR and the eleventh node N11. That is to say, if the highest voltage is applied to the reference node NR, the lowest voltage is applied to the eleventh node N11, and if the lowest voltage is applied to the reference node NR, the highest voltage is applied to the eleventh node N11. Accordingly, there are a case in which the highest voltage or a voltage higher or lower by a predetermined voltage level than the highest voltage is applied to the twenty second node N22 and the third node N3 and a case in which the lowest voltage or a voltage higher or lower by a predetermined voltage level than the lowest voltage is applied to the twenty second node N22 and the third node N3.

The gamma voltage generator 400 shown in FIG. 4 can be used in the case where gamma voltages are commonly applied to RG image signals and gamma voltages are separately applied to B image signals, and the gamma voltage generator 500 shown in FIG. 5 can be used in the case where gamma voltages are separately applied to all of R image signals, G image signals and B image signals. In the same manner in both the two embodiments, RGB common gamma voltages RGB_CG are used for regions having the same gamma characteristics.

As can be readily seen from FIGS. 4 and 5, as gamma voltages are separately applied to R image signals, G image signals and B image signals, the gamma voltage generators 400 and 500 according to the embodiments of the present invention can eliminate the differences in transmittance as shown in the dotted ellipse of FIG. 1.

Figure 6:
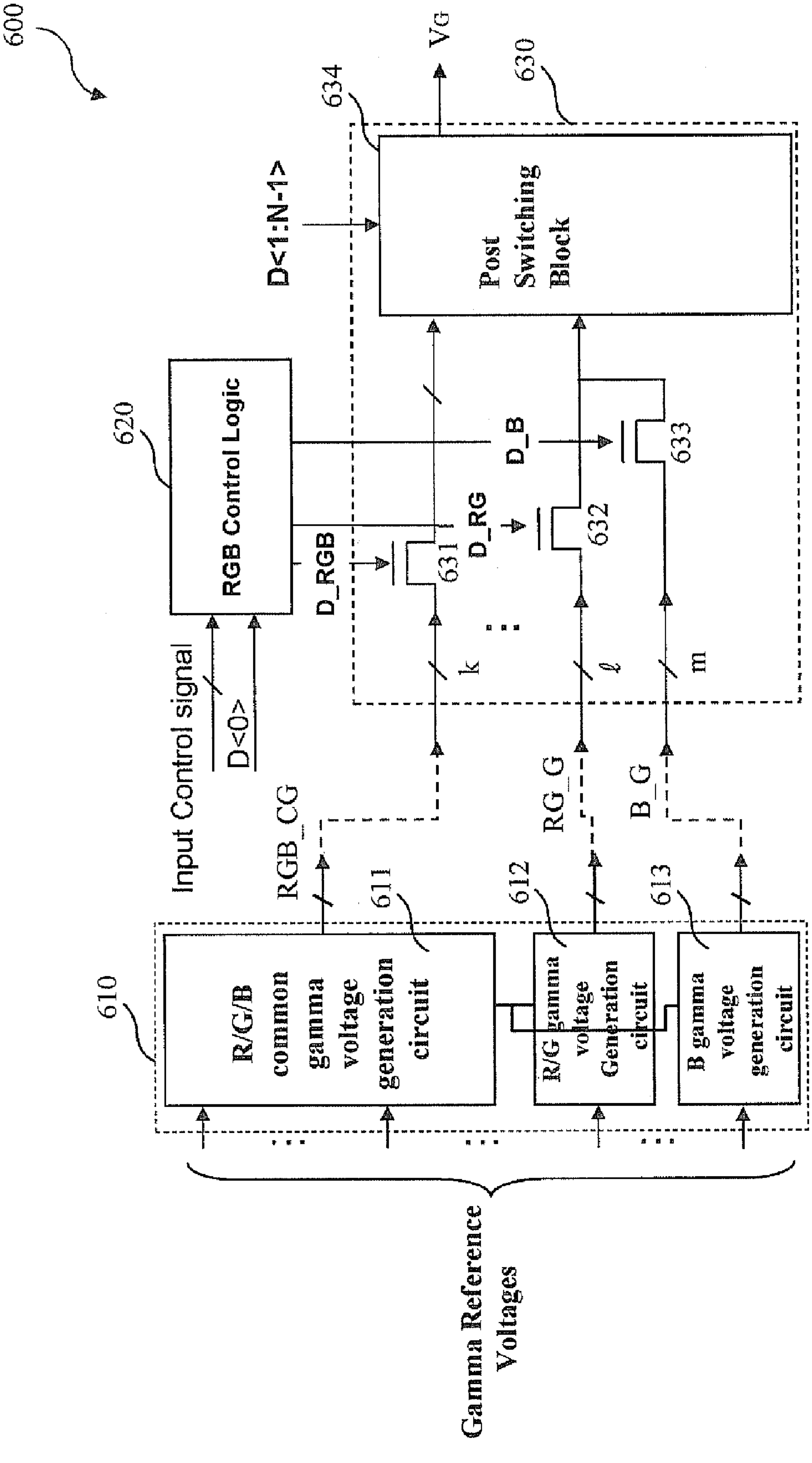
FIG. 6 is a first embodiment of a first type DAC having a gamma voltage generator for generating gamma voltages to be independently applied to RGB image signals.

FIG. 6 is a first embodiment of a first type DAC having a gamma voltage generator for generating gamma voltages to be independently applied to RGB image signals.

Referring to FIG. 6, a first type DAC 600 includes a gamma voltage generator 610, a control circuit 620, and a switching block 630.

The gamma voltage generator 610 generates gamma voltages having the number less than or the same as $2^N$ (N is an integer), using gamma reference voltages. The gamma voltage generator 610 includes an RGB common gamma voltage generation circuit 611 which generates k (k is an integer) number of RGB common gamma voltages RGB_CG, an RG gamma voltage generation circuit 612 which generates l (l is an integer) number of RG gamma voltages RG_G, and a B gamma voltage generation circuit 613 which generates m (m is an integer) number of B gamma voltages B_G. The RGB common gamma voltage generation circuit 611, the RG gamma voltage generation circuit 612 and the B gamma voltage generation circuit 613 correspond to the respective resistor arrays of FIG. 4 which generate the RGB common gamma voltages RGB_CG, the RG gamma voltages RG_G and the B gamma voltages B_G, and this is applied in the same manner to FIGS. 8 and 10 which will be described later, unless otherwise stated.

The control circuit 620 generates k number of RGB driving signals D_RGB for controlling k number of RGB common switches which respectively switch the RGB common gamma voltages RGB_CG, l number of RG driving signals D_RG for controlling l number of RG switches which respectively switch the RG gamma voltages RG_G, and m number of B driving signals D_B for controlling m number of B switches which respectively switch the B gamma voltages B_G, in response to an input control signal and a least significant bit (hereinafter referred to as an "LSB") D<0> of N-bit gamma voltage selection signals D<0:N−1>.

In the case where it is not necessary to divide RG and B, describing the states of the RGB driving signals D_RGB, k/2 number of RGB driving signals D_RGB are enabled and the remaining k/2 number of RGB driving signals D_RGB are disabled according to the logic value of the LSB D<0>. For example, when the logic value of the LSB D<0> is 0 (zero), k/2 number of switches, which select k/2 number of RGB common gamma voltages RGB_CG having relatively low voltage levels among the k number of RGB common gamma voltages RGB_CG, are turned on, and k/2 number of switches, which select the remaining k/2 number of RGB common gamma voltages RGB_CG having relatively high voltage levels among the k number of RGB common gamma voltages RGB_CG, are turned off. In the case where the switches used in the circuit comprise transmission gates realized using CMOSes, the RGB driving signals D_RGB will be applied to switches simultaneously as original signals and signals obtained by inverting the original signals. Even though explanation for the phases of the driving signals will be omitted in the following description, it is to be noted that the use of the signals having inverted phases can be adopted in the same manner.

In the case where it is necessary to divide RG and B, describing the states of the RG driving signals D_RG and the B driving signals D_B, the RG driving signals D_RG and the B driving signals D_B, that are determined by the logic value of the LSB D<0> and the input control signal, are exclusively enables with respect to each other. For example, when the input control signal commands to select RG gamma voltages RG_G, the B driving signals D_B are disabled, and the l number of RG driving signals D_RG are selectively enabled according to the logic value of the LSB D<0>. For example, when the logic value of the LSB D<0> is 0 (zero), switches, which select ½ number of RG gamma voltages RG_G having relatively low voltage levels among the l number of RG gamma voltages RG_G, are turned on, and switches, which select the remaining ½ number of RG gamma voltages RG_G having relatively high voltage levels among the l number of RG gamma voltages RG_G, are turned off.

Conversely, when the input control signal commands to select B gamma voltages B_G, the RG driving signals D_RG are disabled, and the m number of B driving signals D_B are selectively enabled according to the logic value of the LSB D<0>. For example, when the logic value of the LSB D<0> is 1 (one), switches, which select m/2 number of B gamma voltages B_G having relatively high voltage levels among the m number of B gamma voltages B_G, are turned on, and switches, which select the remaining m/2 number of B gamma voltages B_G having relatively low voltage levels among the m number of B gamma voltages B_G, are turned off.

The input control signal includes the information of an image signal for which the gamma correction is to be currently implemented. Referring to FIG. 6, the logic value of the input control signal varies depending upon whether the image signal, for which the gamma correction is to be currently implemented, is RG (red and green) or B (blue).

The switching block 630 selects and outputs one or a plurality of gamma voltages $V_G$ that correspond to bit signals D<1:N−1> remaining by excluding the LSB D<0> of the N-bit gamma voltage selection signals D<0:N−1>, among the RGB common gamma voltages RGB_CG, the RG gamma voltages RG_G and the B gamma voltages B_G, in response to the RGB driving signals D_RGB, the RG driving signals D_RG and the B driving signals D_B. To this end, the switching block 630 has an RGB common switch array 631, an RG switch array 632, a B switch array 633, and a post-switching block 634.

The RGB common switch array 631 has k number of switches which switch the RGB common gamma voltages RGB_CG respectively connected to one terminals thereof to the post-switching block 634 connected to the other terminals thereof in response to the RGB driving signals D_RGB. The RG switch array 632 has l number of switches which switch the RG gamma voltages RG_G respectively connected to one terminals thereof to the post-switching block 634 connected to the other terminals thereof in response to the RG driving signals D_RG. The B switch array 633 has m number of switches which switch the B gamma voltages B_G respectively connected to one terminals thereof to the post-switching block 634 connected to the other terminals thereof in response to the B driving signals D_B.

The post-switching block 634 selects and outputs corresponding gamma voltages among the k number of RGB common gamma voltages RGB_CG applied via the RGB common switch array 631, the l number of RG gamma voltages RG_G applied via the RG switch array 632, and the m number of B gamma voltages B_G applied via the B switch array 633, in response to the bit signals D<1:N−1> remaining by excluding the LSB D<0> from the gamma voltage selection signals D<0:N−1>.

Referring to FIG. 6, although it was illustrated that each of the RGB common switch array 631, the RG switch array 632 and the B switch array 633 comprises only one switch, it is to be noted that the switches of the switch arrays 631, 632 and 633 respectively represent k, l and m number of switches. Unless otherwise stated, this will be applied in the same manner to the following descriptions given with reference to the other drawings.

Figure 7:
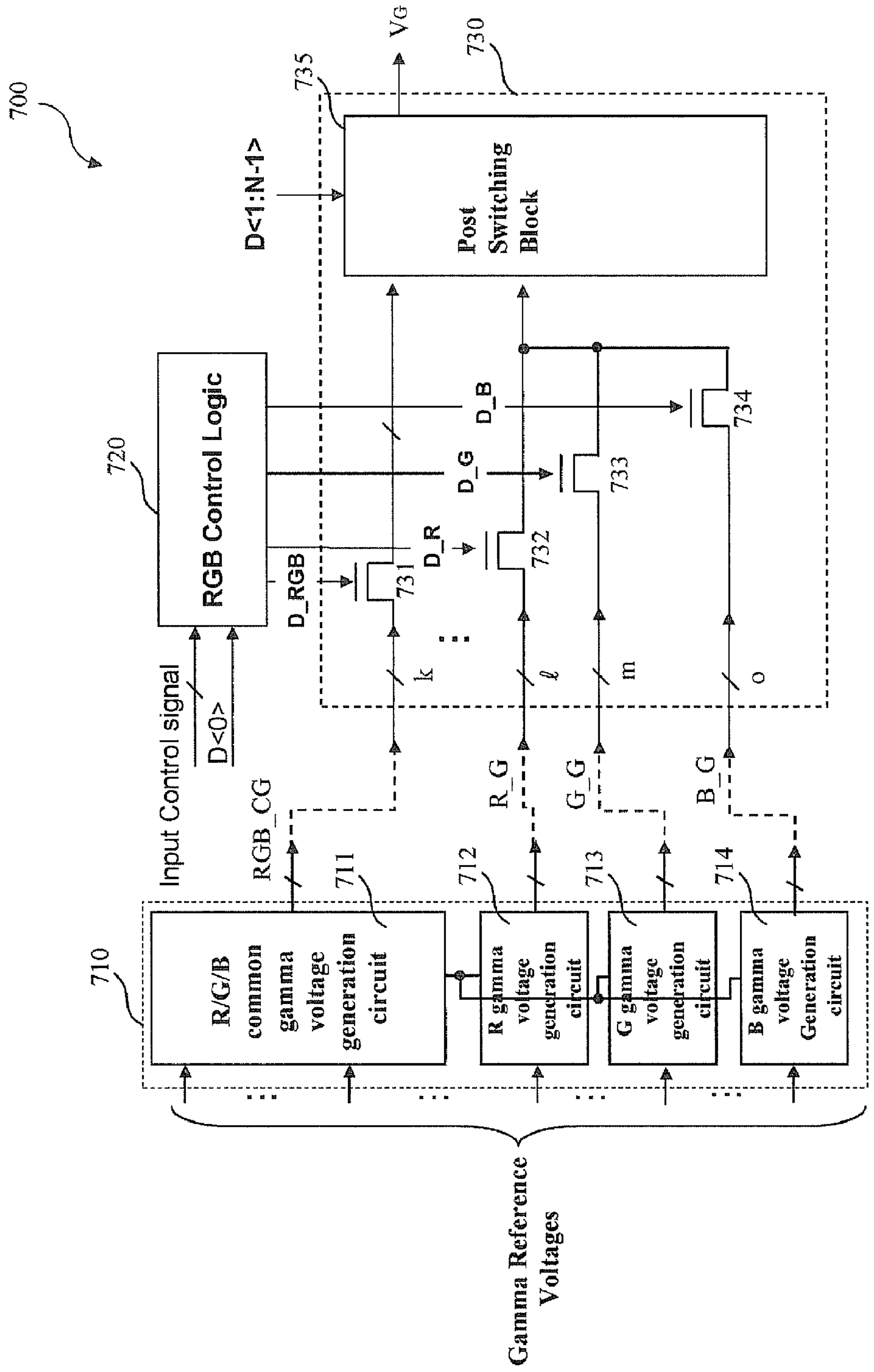
FIG. 7 is a second embodiment of the first type DAC having a gamma voltage generator for generating gamma voltages to be independently applied to RGB image signals.

FIG. 7 is a second embodiment of the first type DAC having a gamma voltage generator for generating gamma voltages to be independently applied to RGB image signals.

Referring to FIG. 7, a first type DAC 700 includes a gamma voltage generator 710, a control circuit 720, and a switching block 730.

The gamma voltage generator 710 generates gamma voltages having the number less than or the same as $2^N$, using gamma reference voltages. The gamma voltage generator 710 includes an RGB common gamma voltage generation circuit 711 which generates k number of RGB common gamma voltages RGB_CG, an R gamma voltage generation circuit 712 which generates l number of R gamma voltages R_G, a G gamma voltage generation circuit 713 which generates m number of G gamma voltages G_G, and a B gamma voltage generation circuit 714 which generates o (o is an integer) number of B gamma voltages B_G. The RGB common gamma voltage generation circuit 711, the R gamma voltage generation circuit 712, the G gamma voltage generation circuit 713 and the B gamma voltage generation circuit 714 correspond to the respective resistor arrays of FIG. 5 which generate the RGB common gamma voltages RGB_CG, the R gamma voltages R_G, the G gamma voltages G_G and the B gamma voltages B_G, and this is applied in the same manner to FIGS. 9 and 11 which will be described later, unless otherwise stated.

The control circuit 720 generates k number of RGB driving signals D_RGB for controlling k number of RGB common switches 731 which respectively switch the RGB common gamma voltages RGB_CG, l number of R driving signals D_R for controlling l number of R switches 732 which respectively switch the l number of R gamma voltages R_G, m number of G driving signals D_G for controlling m number of G switches 733 which respectively switch the m number of G gamma voltages G_G, and o number of B driving signals D_B for controlling o number of B switches which respectively switch the o number of B gamma voltages B_G, in response to an input control signal and an LSB D<0> of N-bit gamma voltage selection signals D<0:N−1>.

The state of the RGB driving signals D_RGB is determined by the logic value of the LSB D<0>, and the states of the R driving signal D_R, the G driving signals D_G and the B driving signals D_B are determined by the logic value of the LSB D<0> and the input control signal.

For example, if the LSB D<0> has a high logic value, k/2 number of RGB driving signals D_RGB are enabled, and conversely, if the LSB D<0> has a low logic value, the remaining k/2 number of RGB driving signals D_RGB are enabled. That is to say, a pair of k/2 number of switches are exclusively enabled with respect to each other depending upon the logic value of the LSB D<0>.

When the input control signal commands to select any ones of the R gamma voltages R_G, the G gamma voltages G_G and the B gamma voltages B_G, the R driving signals D_R, the G driving signals D_G and the B driving signals D_B are selectively enabled according to the logic value of the LSB D<0>. For example, when the input control signal commands to select the R gamma voltages R_G and the logic value of the LSB D<0> is 0 (zero), switches, which select ½ number of R gamma voltages R_G having relatively high voltage levels among the l number of R gamma voltages R_G, are turned on, and switches, which select the remaining ½ number of R gamma voltages R_G having relatively low voltage levels among the l number of R gamma voltages R_G, are turned off.

The enabling of the RGB driving signals D_RGB and the enabling of the R driving signals D_R, the G driving signals D_G and the B driving signals D_B are independently implemented with respect to each other. The R driving signals D_R, the G driving signals D_G and the B driving signals D_B are exclusively enabled with respect to one another. Therefore, signals that are enabled simultaneously with the RGB driving signals D_RGB are any ones of the R driving signals D_R, the G driving signals D_G and the B driving signals D_B.

The input control signal includes the information of an image signal for which the gamma correction is to be currently implemented. Referring to FIG. 7, the logic value of the input control signal varies depending upon whether the image signal, for which the gamma correction is to be currently implemented, is R (red), G (green) or B (blue).

The switching block 730 selects and outputs gamma voltages $V_G$ that correspond to bit signals D<1:N−1> remaining by excluding the LSB D<0> of the N-bit gamma voltage selection signals D<0:N−1>, among the RGB common gamma voltages RGB_CG, the R gamma voltages R_G, the G gamma voltages G_G and the B gamma voltages B_G, in response to the RGB driving signals D_RGB, the R driving signals D_R, the G driving signals D_G and the B driving signals D_B. To this end, the switching block 730 has an RGB common switch array 731, an R switch array 732, a G switch array 733, a B switch array 734, and a post-switching block 735.

The RGB common switch array 731 has k number of switches which switch the RGB common gamma voltages RGB_CG respectively connected to one terminals thereof to the post-switching block 735 connected to the other terminals thereof in response to the RGB driving signals D_RGB. The R switch array 732 has l number of switches which switch the R gamma voltages R_G respectively connected to one terminals thereof to the post-switching block 735 connected to the other terminals thereof in response to the R driving signals D_R. The G switch array 733 has m number of switches which switch the G gamma voltages G_G respectively connected to one terminals thereof to the post-switching block 735 connected to the other terminals thereof in response to the G driving signals D_G. The B switch array 734 has o number of switches which switch the B gamma voltages B_G respectively connected to one terminals thereof to the post-switching block 735 connected to the other terminals thereof in response to the B driving signals D_B.

The post-switching block 735 selects and outputs corresponding gamma voltages among the k number of RGB common gamma voltages RGB_CG applied via the RGB common switch array 731, the l number of R gamma voltages R_G applied via the R switch array 732, the m number of G gamma voltages G_G applied via the G switch array 733, and the o number of B gamma voltages B_G applied via the B switch array 734, in response to the bit signals D<1:N−1> remaining by excluding the LSB D<0> of the gamma voltage selection signals D<0:N−1>.

Figure 8:
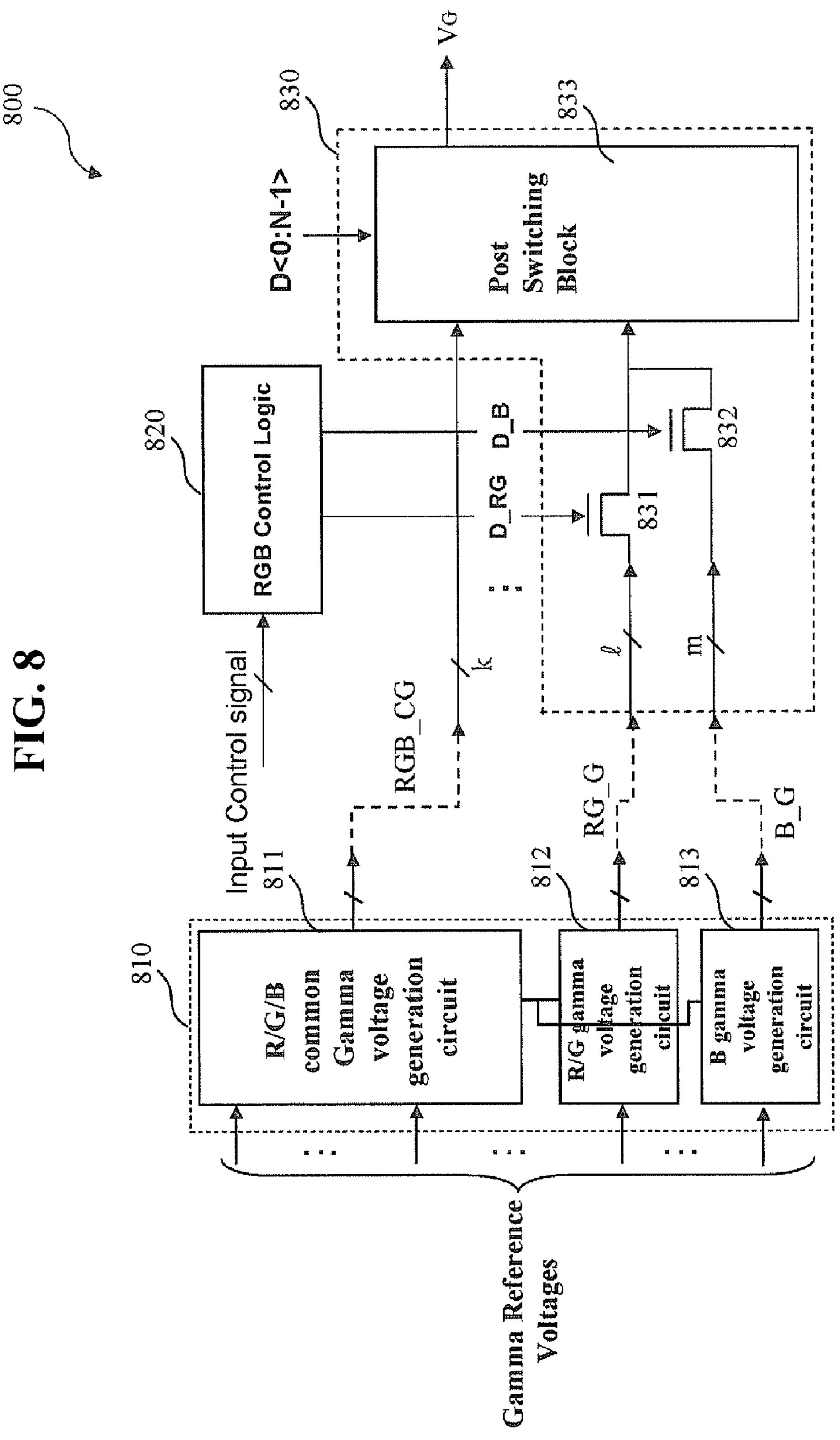
FIG. 8 is a first embodiment of a second type DAC having a gamma voltage generator for generating gamma voltages to be independently applied to RGB image signals.

FIG. 8 is a first embodiment of a second type DAC having a gamma voltage generator for generating gamma voltages to be independently applied to RGB image signals.

Referring to FIG. 8, a second type DAC 800 according to the present invention includes a gamma voltage generator 810, a control circuit 820, and a switching block 830.

The gamma voltage generator 810 generates gamma voltages having the number less than or the same as $2^N$, using gamma reference voltages. The gamma voltage generator 810 includes an RGB common gamma voltage generation circuit 811 which generates k number of RGB common gamma voltages RGB_CG, an RG gamma voltage generation circuit 812 which generates l number of RG gamma voltages RG_G, and a B gamma voltage generation circuit 813 which generates m number of B gamma voltages B_G. The RGB common gamma voltage generation circuit 811, the RG gamma voltage generation circuit 812 and the B gamma voltage generation circuit 813 correspond to the respective resistor arrays of FIG. 4 which generate the RGB common gamma voltages RGB_CG, the RG gamma voltages RG_G and the B gamma voltages B_G. The k number of RGB common gamma voltages RGB_CG outputted from the RGB common gamma voltage generation circuit 811 are directly transmitted to the switching block 830.

The control circuit 820 generates RG driving signals D_RG for controlling l number of RG switches 831 which respectively switch the RG gamma voltages RG_G, and B driving signals D_B for controlling m number of B switches 832 which respectively switch the B gamma voltages B_G, in response to an input control signal.

The states of the RG driving signals D_RG and the B driving signals D_B are determined depending upon the logic value of the input control signal. In other words, in the case where an image signal, for which the gamma correction is to be currently implemented, is R (red), the RG driving signals D_RG and the B driving signals D_B are entirely disabled, otherwise the RG driving signals D_RG and the B driving signals D_B are exclusively enabled with respect to each other.

The switching block 830 selects and outputs gamma voltages $V_G$ that correspond to N-bit gamma voltage selection signals D<0:N−1>, among the RGB common gamma voltages RGB_CG directly transmitted thereto, and the RG gamma voltages RG_G and the B gamma voltages B_G received in response to the RG driving signals D_RG and the B driving signals D_B. To this end, the switching block 830 has an RG switch array 831, a B switch array 832, and a post-switching block 833.

The RG switch array 831 has l number of switches which switch the RG gamma voltages RG_G respectively connected to one terminals thereof to the post-switching block 833 connected to the other terminals thereof in response to the RG driving signals D_RG. The B switch array 832 has m number of switches which switch the B gamma voltages B_G respectively connected to one terminals thereof to the post-switching block 833 connected to the other terminals thereof in response to the B driving signals D_B.

The post-switching block 833 selects and outputs the gamma voltages $V_G$ that correspond to the N-bit gamma voltage selection signals D<0:N−1>, among the k number of RGB common gamma voltages RGB_CG directly transmitted thereto, the l number of RG gamma voltages RG_G applied via the RG switch array 831, and the m number of B gamma voltages B_G applied via the B switch array 832.

Figure 9:
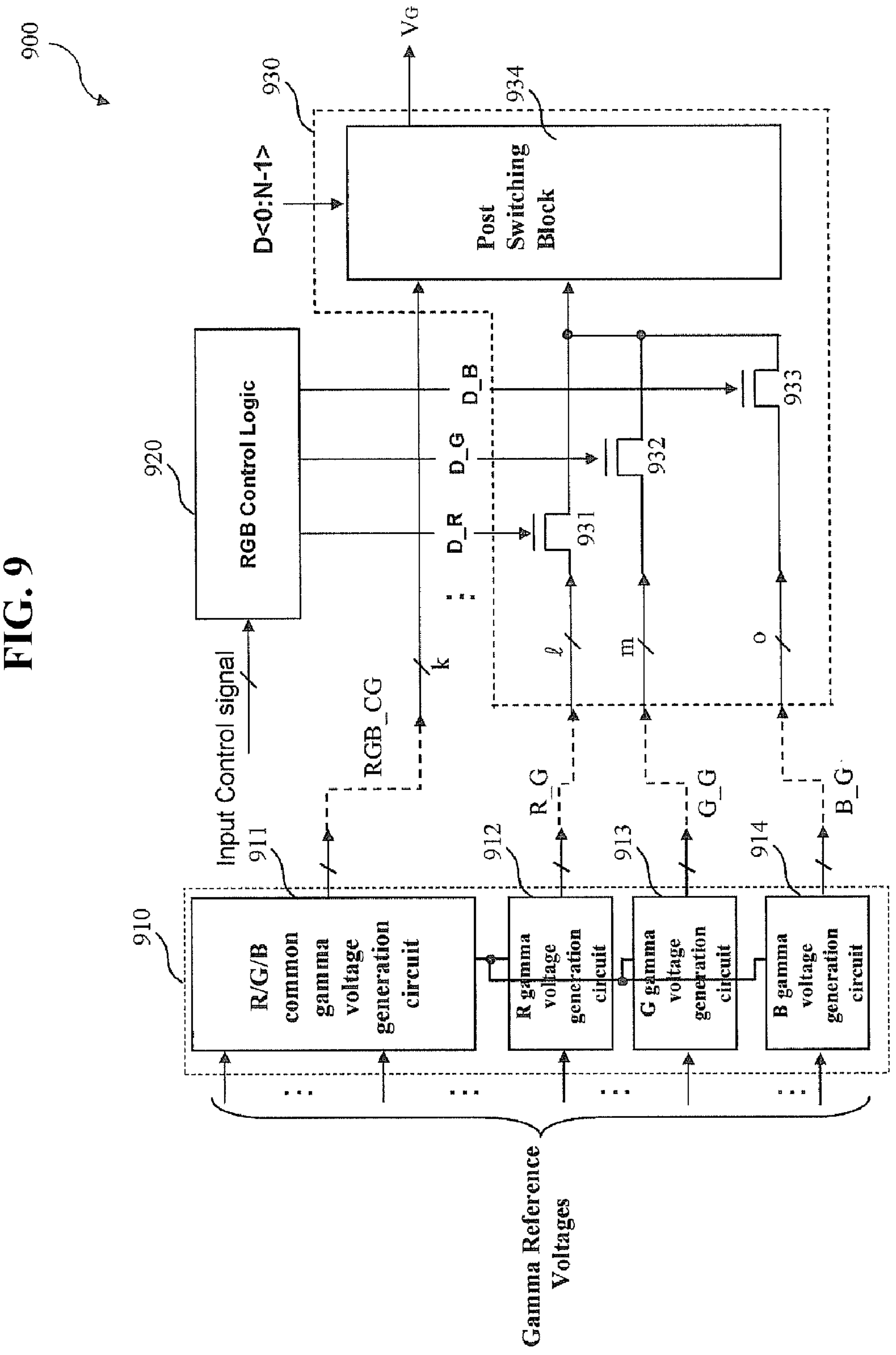
FIG. 9 is a second embodiment of the second type DAC having a gamma voltage generator for generating gamma voltages to be independently applied to RGB image signals.

FIG. 9 is a second embodiment of the second type DAC having a gamma voltage generator for generating gamma voltages to be independently applied to RGB image signals.

Referring to FIG. 9, a second type DAC 900 according to the present invention includes a gamma voltage generator 910, a control circuit 920, and a switching block 930.

The gamma voltage generator 910 generates gamma voltages having the number less than or the same as $2^N$, using gamma reference voltages. The gamma voltage generator 910 includes an RGB common gamma voltage generation circuit 911 which generates k number of RGB common gamma voltages RGB_CG, an R gamma voltage generation circuit 912 which generates l number of R gamma voltages R_G, a G gamma voltage generation circuit 913 which generates m number of G gamma voltages G_G, and a B gamma voltage generation circuit 914 which generates o number of B gamma voltages B_G. The RGB common gamma voltage generation circuit 911, the R gamma voltage generation circuit 912, the G gamma voltage generation circuit 913 and the B gamma voltage generation circuit 914 correspond to the respective resistor arrays of FIG. 5 which generate the RGB common gamma voltages RGB_CG, the R gamma voltages R_G, the G gamma voltages G_G and the B gamma voltages B_G. The RGB common gamma voltages RGB_CG generated from the RGB common gamma voltage generation circuit 911 are directly transmitted to the switching block 930.

The control circuit 920 generates R driving signals D_R for controlling l number of R switches 931 which respectively switch the R gamma voltages R_G, G driving signals D_G for controlling m number of G switches 932 which respectively switch the G gamma voltages G_G, and B driving signals D_B for controlling o number of B switches 933 which respectively switch the B gamma voltages B_G, in response to an input control signal.

The states of the R driving signals D_R, the G driving signals D_G and the B driving signals D_B are exclusively enabled by the input control signal. Depending upon the logic value of the input control signal, the R driving signals D_R, the G driving signals D_G and the B driving signals D_B are entirely disabled, otherwise the R driving signals D_R, the G driving signals D_G and the B driving signals D_B are exclusively enabled with respect to one another.

The input control signal includes the information of an image signal for which the gamma correction is to be currently implemented. Referring to FIG. 9, the logic value of the input control signal varies depending upon whether the image signal, for which the gamma correction is to be currently implemented, is R (red), G (green) or B (blue).

The switching block 930 has an R switch array 931, a G switch array 932, a B switch array 933, and a post-switching block 934. The switching block 930 selects and outputs gamma voltages $V_G$ that correspond to N-bit gamma voltage selection signals D<0:N−1>, among the RGB common gamma voltages RGB_CG directly transmitted thereto, and the R gamma voltages R_G, the G gamma voltages G_G and the B gamma voltages B_G received via the R switch array 931, the G switch array 932 and the B switch array 933 which are switched in response to the R driving signals D_R, the G driving signals D_G and the B driving signals D_B, respectively.

The R switch array 931 has l number of switches which switch the R gamma voltages R_G respectively connected to one terminals thereof to the post-switching block 934 connected to the other terminals thereof in response to the R driving signals D_R. The G switch array 932 has m number of switches which switch the G gamma voltages G_G respectively connected to one terminals thereof to the post-switching block 934 connected to the other terminals thereof in response to the G driving signals D_G. The B switch array 933 has o number of switches which switch the B gamma voltages B_G respectively connected to one terminals thereof to the post-switching block 934 connected to the other terminals thereof in response to the B driving signals D_B.

The post-switching block 934 outputs the gamma voltages $V_G$ that correspond to the N-bit gamma voltage selection signals D<0:N−1>, among the k number of RGB common gamma voltages RGB_CG generated by the RGB common gamma voltage generation circuit 911 and directly transmitted thereto, the l number of R gamma voltages R_G applied via the R switch array 931, the m number of G gamma voltages G_G applied via the G switch array 932, and the o number of B gamma voltages B_G applied via the B switch array 933.

Figure 10:
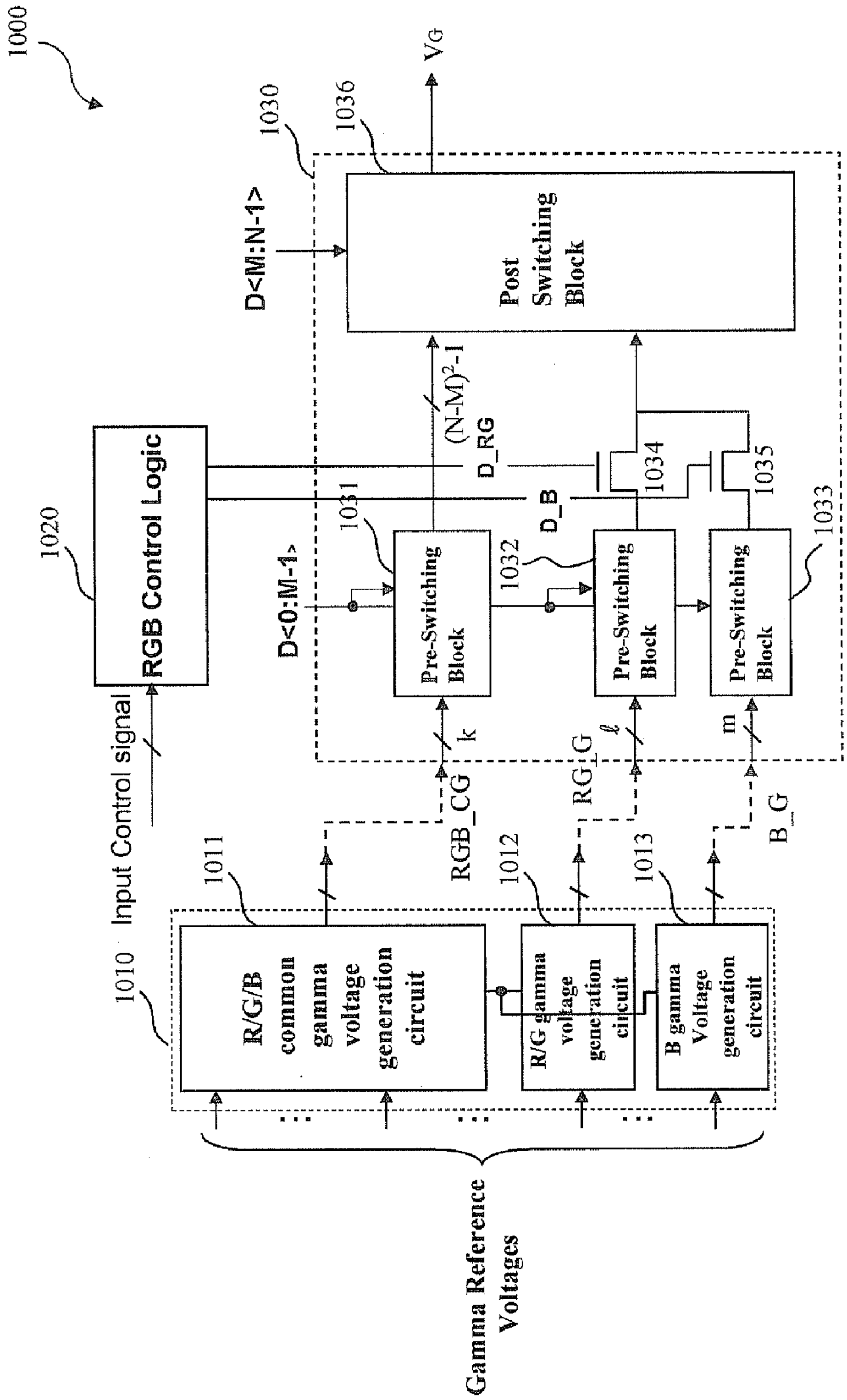
FIG. 10 is a first embodiment of a third type DAC having a gamma voltage generator for generating gamma voltages to be independently applied to RGB image signals.

FIG. 10 is a first embodiment of a third type DAC having a gamma voltage generator for generating gamma voltages to be independently applied to RGB image signals.

Referring to FIG. 10, a third type DAC 1000 according to the present invention includes a gamma voltage generator 1010, a control circuit 1020, and a switching block 1030.

The gamma voltage generator 1010 generates gamma voltages having the number less than or the same as $2^N$, using gamma reference voltages. The gamma voltage generator 1010 includes an RGB common gamma voltage generation circuit 1011 which generates k number of RGB common gamma voltages RGB_CG, an RG gamma voltage generation circuit 1012 which generates l number of RG gamma voltages RG_G, and a B gamma voltage generation circuit 1013 which generates m number of B gamma voltages B_G.

The control circuit 1020 generates RG driving signals D_RG for controlling RG switches 1034 and B driving signals D_B for controlling B switches 1035 in response to an input control signal. The states of the RG driving signals D_RG and the B driving signals D_B are determined depending upon the logic value of the input control signal. In the case where an image signal, for which the gamma correction is to be currently implemented, is R (red) or G (green), the RG driving signals D_RG are exclusively enabled, and in the case where an image signal, for which the gamma correction is to be currently implemented, is B (blue), the B driving signals D_B are exclusively enabled.

The switching block 1030 has an RGB pre-switching block 1031, an RG pre-switching block 1032, a B pre-switching block 1033, the RG switches 1034, the B switches 1035, and a post-switching block 1036.

The RGB pre-switching block 1031 selects gamma voltages that correspond to lower M bits D<0:M−1> of N-bit gamma voltage selection signals D<0:N−1>, among the RGB common gamma voltages RGB_CG. The RG pre-switching block 1032 selects gamma voltages that correspond to the lower M bits D<0:M−1> of the N-bit gamma voltage selection signals D<0:N−1>, among the RG gamma voltages RG_G. The B pre-switching block 1033 selects gamma voltages that correspond to the lower M bits D<0:M−1> of the N-bit gamma voltage selection signals D<0:N−1>, among the B gamma voltages B_G.

The RG switches 1034 switch the RG gamma voltages RG_G selected and outputted from the RG pre-switching block 1032 in response to the RG driving signals D_RG, and the B switches 1035 switch the B gamma voltages B_G selected and outputted from the B pre-switching block 1033 in response to the B driving signals D_B. Since the RG driving signals D_RG and the B driving signals D_B are exclusively enabled with respect to each other, the RG switches 1034 and the B switches 1035 are also exclusively switched with respect to each other. Accordingly, the gamma voltages selected among the RG gamma voltages RG_G and the gamma voltages selected among the B gamma voltages B_G are likewise exclusively transmitted to the post-switching block 1036 with respect to each other.

Because l and m correspond to $2^M$, when assuming for the sake of convenience in explanation that the number of the gamma voltages is $2^N$, k becomes $2^N$-$2^M$. Among the $2^N$ gamma voltages corresponding to the N bits, the total number of the gamma voltages that correspond to the lower M bits becomes $(N-M)^2$. Since the gamma voltage selected from the RG pre-switching block 1032 and the B pre-switching block 1033 will be one, the total number of the gamma voltages selected and outputted from the RGB pre-switching block 1031 will be $(N-M)^2-1$.

The post-switching block 1036 selects and outputs gamma voltages $V_G$ that correspond to (N−M) bits D<M:N−1> remaining by excluding the lower M bits D<0:M−1> of the N-bit gamma voltage selection signals D<0:N−1>, among the $(N-M)^2-1$ number of gamma voltages outputted from the RGB pre-switching block 1031 and one gamma voltage selected and outputted from the RG pre-switching block 1032 or the B pre-switching block 1033.

Figure 11:
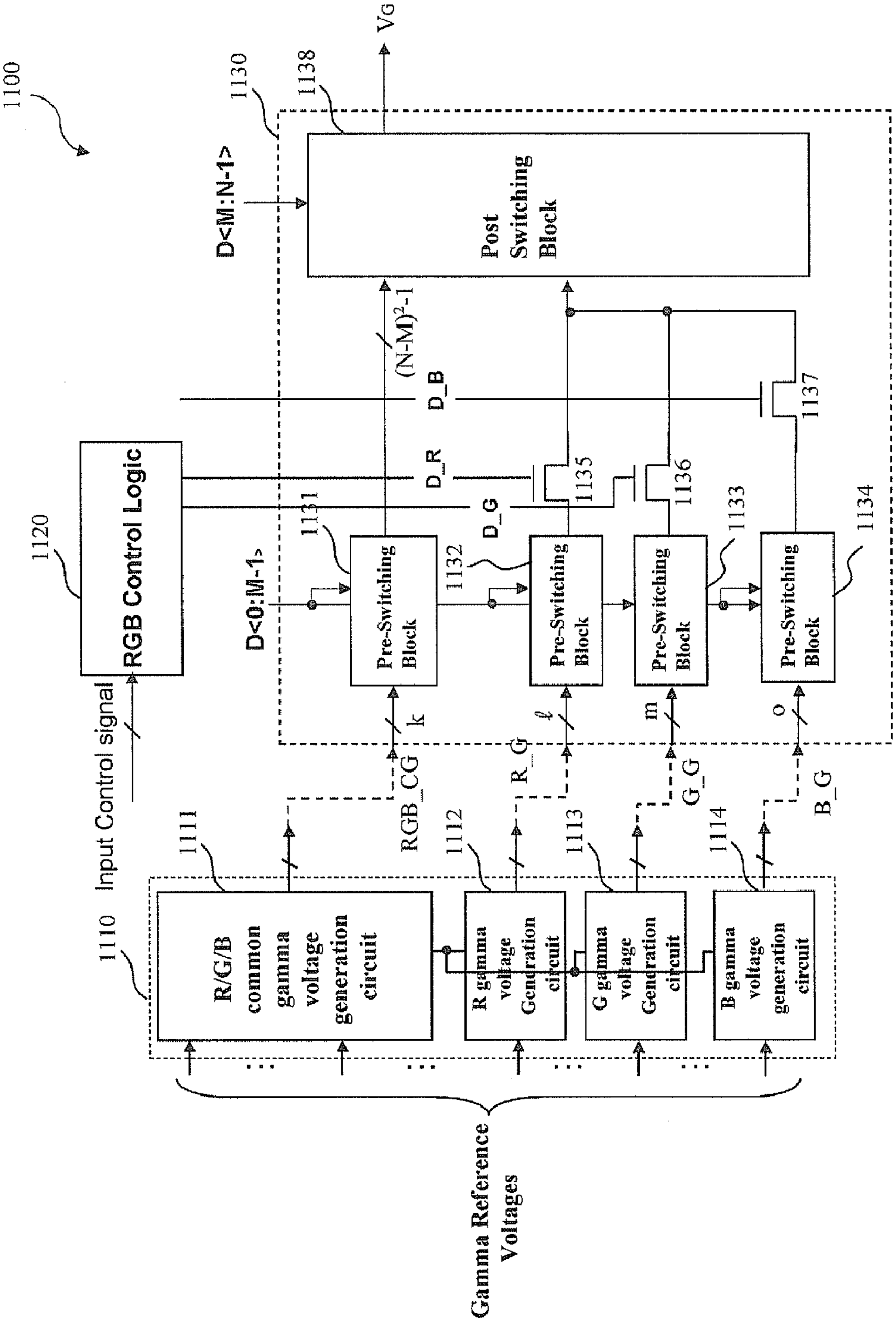
FIG. 11 is a second embodiment of the third type DAC having a gamma voltage generator for generating gamma voltages to be independently applied to RGB image signals.

FIG. 11 is a second embodiment of the third type DAC having a gamma voltage generator for generating gamma voltages to be independently applied to RGB image signals.

Referring to FIG. 11, a third type DAC 1100 according to the present invention includes a gamma voltage generator 1110, a control circuit 1120, and a switching block 1130.

The gamma voltage generator 1110 generates gamma voltages having the number less than or the same as $2^N$, using gamma reference voltages. The gamma voltage generator 1110 includes an RGB common gamma voltage generation circuit 1111 which generates k number of RGB common gamma voltages RGB_CG, an R gamma voltage generation circuit 1112 which generates l number of R gamma voltages R_G, a G gamma voltage generation circuit 1113 which generates m number of G gamma voltages G_G, and a B gamma voltage generation circuit 1114 which generates o number of B gamma voltages B_G.

The control circuit 1120 generates R driving signals D_R for controlling R switches 1135, G driving signals D_G for controlling G switches 1136, and B driving signals D_B for controlling B switches 1137 in response to an input control signal. The states of the R driving signals D_R, the G driving signals D_G and the B driving signals D_B are determined depending upon the logic value of the input control signal. For example, in the case where an image signal, for which the gamma correction is to be currently implemented, is R (red), G (green) or B (blue), the R driving signals D_R, the G driving signals D_G or the B driving signals D_B are exclusively enabled with respect to one another.

The switching block 1130 has an RGB pre-switching block 1131, an R pre-switching block 1132, a G pre-switching block 1133, a B pre-switching block 1134, the R switches 1135, the G switches 1136, the B switches 1137, and a post-switching block 1138.

The RGB pre-switching block 1131 selects gamma voltages that correspond to lower M bits D<0:M−1> of N-bit gamma voltage selection signals D<0:N−1>, among the RGB common gamma voltages RGB_CG. The R pre-switching block 1132 selects gamma voltages that correspond to the lower M bits D<0:M−1> of the N-bit gamma voltage selection signals D<0:N−1>, among the R gamma voltages R_G. The G pre-switching block 1133 selects gamma voltages that correspond to the lower M bits D<0:M−1> of the N-bit gamma voltage selection signals D<0:N−1>, among the G gamma voltages G_G. The B pre-switching block 1134 selects gamma voltages that correspond to the lower M bits D<0:M−1> of the N-bit gamma voltage selection signals D<0:N−1>, among the B gamma voltages B_G. The R switches 1135 switch the R gamma voltages R_G selected and outputted from the R pre-switching block 1132 in response to the R driving signals D_R. The G switches 1136 switch the G gamma voltages G_G selected and outputted from the G pre-switching block 1133 in response to the G driving signals D_G. The B switches 1137 switch the B gamma voltages B_G selected and outputted from the B pre-switching block 1134 in response to the B driving signals D_B.

Since the R driving signals D_R, the G driving signals D_G and the B driving signals D_B are exclusively enabled with respect to one another, the R switches 1135, the G switches 1136 and the B switches 1137 are also exclusively switched with respect to one another. Accordingly, the gamma voltages selected among the R gamma voltages R_G, the gamma voltages selected among the G gamma voltages G_G and the gamma voltages selected among the B gamma voltages B_G are likewise exclusively transmitted to the post-switching block 1138 with respect to one another.

Because l and m correspond to $2^M$, when assuming that the number of the gamma voltages is $2^N$, k becomes $2^N-2^M$. Among the $2^N$ gamma voltages corresponding to the N bits, the total number of the gamma voltages that correspond to the lower M bits becomes $(N-M)^2$. Since the gamma voltage selected from the R pre-switching block 1132, the G pre-switching block 1133 and the B pre-switching block 1134 will be one, the total number of the gamma voltages selected and outputted from the RGB pre-switching block 1131 will be $(N-M)^2-1$.

The post-switching block 1138 selects and outputs gamma voltages $V_G$ that correspond to (N−M) bits D<M:N−1> remaining by excluding the lower M bits D<0:M−1> of the N-bit gamma voltage selection signals D<0:N−1>, among the $(N-M)^2-1$ number of gamma voltages outputted from the RGB pre-switching block 1131 and one gamma voltage selected and outputted from the R pre-switching block 1132, the G pre-switching block 1133 or the B pre-switching block 1134.

In FIGS. 6, 8 and 10, it is the norm that l and m have the same number, and in this case, the sum (k+l) of k and l and the sum (k+m) of k and m all become $2^N$. In FIGS. 7, 9 and 11, it is the norm that l, m and o have the same number, and in this case, the sum (k+l) of k and l, the sum (k+m) of k and m and the sum (k+o) of k and o all become $2^N$.

In the first type DACs shown in FIGS. 6 and 7, the control circuits 620 and 720 generate the driving signals using the LSB D<0> in addition to the input control signal, and therefore, the switching blocks 630 and 730 are all configured to operate in response to the (N−1) bits D<1:N−1>.

In the second type DACs shown in FIGS. 8 and 9, the control circuits 820 and 920 generate the driving signals D_RG and D_B, and D_R, D_B and D_G using only the LSB D<0> of the gamma voltage selection signals, and therefore, the switching blocks 830 and 930 are all configured to operate in response to the N bits D<0:N−1>.

In the third type DACs shown in FIGS. 10 and 11, the switching blocks 1030 and 1130 are divided into the pre-switching blocks 1031, 1032 and 1033, and 1131, 1132, 1133 and 1134 which operate in response to the lower bits D<0:M−1> of the gamma voltage selection signals and the post-switching blocks 1036 and 1138 which operate in response to the remaining bits D<M:N−1>.

As is apparent from the above description, a gamma voltage generator and a DAC having the same according to the present invention provide advantages in that R, G and B image signals can be partially optimized such that the transmittances of the R, G and B image signals can be different through a specific range of gray scale.

Although preferred embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A digital-to-analog converter comprising:

a gamma voltage generator configured to generate at least three kinds among RGB common gamma voltages, RG gamma voltages, R gamma voltages, G gamma voltages and B gamma voltages, using gamma reference voltages;

a control circuit configured to generate at least three driving signals among an RGB driving signal, an RG driving signal, an R driving signal, a G driving signal and a B driving signal in response to an input control signal and a least significant bit of N-bit (N is an integer) gamma voltage selection signals; and a switching block configured to switch the RGB common gamma voltages, the RG gamma voltages, the R gamma voltages, the G gamma voltages and the B gamma voltages in response to at least three corresponding driving signals among the RGB driving signal, the RG driving signal, the R driving signal, the G driving signal and the B driving signal, and select and output gamma voltages that correspond to bits remaining by excluding the least significant bit from the N-bit gamma voltage selection signals.

2. The digital-to-analog converter according to claim 1, wherein the gamma voltage generator comprises:

an RGB common gamma voltage generation circuit configured to generate the RGB common gamma voltages using the gamma reference voltages;

an RG gamma voltage generation circuit configured to generate the RG gamma voltages using the gamma reference voltages; and a B gamma voltage generation circuit configured to generate the B gamma voltages using the gamma reference voltages.

3. The digital-to-analog converter according to claim 1, wherein the switching block comprises:

an RGB common switch array configured to switch the RGB common gamma voltages respectively connected to one terminals thereof to a post-switching block connected to the other terminals thereof in response to the RGB driving signal, an RG switch array configured to switch the RG gamma voltages respectively connected to one terminals thereof to the post-switching block connected to the other terminals thereof in response to the RG driving signal, a B switch array configured to switch the B gamma voltages respectively connected to one terminals thereof to the post-switching block connected to the other terminals thereof in response to the B driving signal, and the post-switching block configured to select and output gamma voltages that correspond to remaining gamma voltage selection signals, among the gamma voltages outputted from the RGB common switch array, the RG switch array and the B switch array; and wherein a plurality of switches are arranged in each of the switch arrays to implement switching operation in response to a corresponding driving signal.

4. The digital-to-analog converter according to claim 1, wherein the gamma voltage generator comprises:

an RGB common gamma voltage generation circuit configured to generate the RGB common gamma voltages using the gamma reference voltages;

an R gamma voltage generation circuit configured to generate the R gamma voltages using the gamma reference voltages;

a G gamma voltage generation circuit configured to generate the G gamma voltages using the gamma reference voltages;

a B gamma voltage generation circuit configured to generate the B gamma voltages using the gamma reference voltages.

5. The digital-to-analog converter according to claim 4, wherein the switching block comprises:

an RGB common switch array configured to switch the RGB common gamma voltages respectively connected to one terminals thereof to a post-switching block connected to the other terminals thereof in response to the RGB driving signal, an R switch array configured to switch the R gamma voltages respectively connected to one terminals thereof to the post-switching block connected to the other terminals thereof in response to the R driving signal, a G switch array configured to switch the G gamma voltages respectively connected to one terminals thereof to the post-switching block connected to the other terminals thereof in response to the G driving signal, a B switch array configured to switch the B gamma voltages respectively connected to one terminals thereof to the post-switching block connected to the other terminals thereof in response to the B driving signal, and the post-switching block configured to select and output gamma voltages that correspond to remaining gamma voltage selection signals, among the gamma voltages outputted from the RGB common switch array, the R switch array, the G switch array and the B switch array; and wherein a plurality of switches are arranged in each of the switch arrays to implement switching operation in response to a corresponding driving signal.

6. A digital-to-analog converter comprising:

a gamma voltage generator configured to generate at least three kinds among RGB common gamma voltages, RG gamma voltages, R gamma voltages, G gamma voltages and B gamma voltages, using gamma reference voltages;

a control circuit configured to generate at least two driving signals among an RG driving signal, an R driving signal, a G driving signal and a B driving signal in response to an input control signal; and a switching block configured to select and output gamma voltages that correspond to N-bit gamma voltage selection signals, among the RGB common gamma voltages directly transmitted thereto, and the RG gamma voltages, the R gamma voltages, the G gamma voltages and the B gamma voltages received through switching in response to at least two driving signals among the RG driving signal, the R driving signal, the G driving signal and the B driving signal.

7. The digital-to-analog converter according to claim 6, wherein the gamma voltage generator comprises:

an RGB common gamma voltage generation circuit configured to generate the RGB common gamma voltages using the gamma reference voltages;

an RG gamma voltage generation circuit configured to generate the RG gamma voltages using the gamma reference voltages; and a B gamma voltage generation circuit configured to generate the B gamma voltages using the gamma reference voltages.

8. The digital-to-analog converter according to claim 6, wherein the switching block comprises:

an RG switch array configured to switch the RG gamma voltages respectively connected to one terminals thereof to a post-switching block connected to the other terminals thereof in response to the RG driving signal, a B switch array configured to switch the B gamma voltages respectively connected to one terminals thereof to the post-switching block connected to the other terminals thereof in response to the B driving signal, and the post-switching block configured to select and output gamma voltages that correspond to the gamma voltage selection signals, among the RGB common gamma voltages directly transmitted thereto and gamma voltages outputted from the RG switch array and the B switch array; and wherein a plurality of switches are arranged in each of the switch arrays to implement switching operation in response to a corresponding driving signal.

9. The digital-to-analog converter according to claim 6, wherein the gamma voltage generator comprises:

an RGB common gamma voltage generation circuit configured to generate the RGB common gamma voltages using the gamma reference voltages;

an R gamma voltage generation circuit configured to generate the R gamma voltages using the gamma reference voltages;

a G gamma voltage generation circuit configured to generate the G gamma voltages using the gamma reference voltages;

a B gamma voltage generation circuit configured to generate the B gamma voltages using the gamma reference voltages.

10. The digital-to-analog converter according to claim 9, wherein the switching block comprises:

an R switch array configured to switch the R gamma voltages respectively connected to one terminals thereof to a post-switching block connected to the other terminals thereof in response to the R driving signal, a G switch array configured to switch the G gamma voltages respectively connected to one terminals thereof to the post-switching block connected to the other terminals thereof in response to the G driving signal, a B switch array configured to switch the B gamma voltages respectively connected to one terminals thereof to the post-switching block connected to the other terminals thereof in response to the B driving signal, and the post-switching block configured to select and output gamma voltages that correspond to the gamma voltage selection signals, among the RGB common gamma voltages directly transmitted thereto and gamma voltages outputted from the R switch array, the G switch array and the B switch array; and wherein a plurality of switches are arranged in each of the switch arrays to implement switching operation in response to a corresponding driving signal.

11. A digital-to-analog converter comprising:

a gamma voltage generator configured to generate at least three kinds among RGB common gamma voltages, RG gamma voltages, R gamma voltages, G gamma voltages and B gamma voltages, using gamma reference voltages;

a control circuit configured to generate at least two driving signals among an RG driving signal, an R driving signal, a G driving signal and a B driving signal in response to an input control signal; and a switching block configured to select and output gamma voltages that correspond to N-bit gamma voltage selection signals, among the RGB common gamma voltages, the RG gamma voltages, the R gamma voltages, the G gamma voltages and the B gamma voltages, in response to at least two driving signals among the RG driving signal, the R driving signal, the G driving signal and the B driving signal.

12. The digital-to-analog converter according to claim 11, wherein the gamma voltage generator comprises:

an RGB common gamma voltage generation circuit configured to generate the RGB common gamma voltages using the gamma reference voltages;

an RG gamma voltage generation circuit configured to generate the RG gamma voltages using the gamma reference voltages; and a B gamma voltage generation circuit configured to generate the B gamma voltages using the gamma reference voltages.

13. The digital-to-analog converter according to claim 11, wherein the switching block comprises:

an RGB pre-switching block configured to switch gamma voltages that correspond to lower M bits of N-bit gamma voltage selection signals, among the RGB common gamma voltages, an RG pre-switching block configured to switch gamma voltages that correspond to the lower M bits of the N-bit gamma voltage selection signals, among the RG gamma voltages, a B pre-switching block configured to switch gamma voltages that correspond to the lower M bits of the N-bit gamma voltage selection signals, among the B gamma voltages, an RG switch array configured to transmit the gamma voltages outputted from the RG pre-switching block connected to one terminals thereof to a post-switching block in response to the RG driving signals, a B switch array configured to switch the gamma voltages outputted from the B pre-switching block connected to one terminals thereof to the post-switching block in response to the B driving signals, and the post-switching block configured to select and output gamma voltages that correspond to bits remaining by excluding the lower M bits of the gamma voltage selection signals, among the gamma voltages outputted from the RGB pre-switching block, the gamma voltages outputted via the RG switch array from the RG pre-switching block, and the gamma voltages outputted via the B switch array from the B pre-switching block; and wherein a plurality of switches are arranged in each of the switch arrays to implement switching operation in response to a corresponding driving signal.

14. The digital-to-analog converter according to claim 11, wherein the gamma voltage generator comprises:

an RGB common gamma voltage generation circuit configured to generate the RGB common gamma voltages using the gamma reference voltages;

an R gamma voltage generation circuit configured to generate the R gamma voltages using the gamma reference voltages;

a G gamma voltage generation circuit configured to generate the G gamma voltages using the gamma reference voltages;

a B gamma voltage generation circuit configured to generate the B gamma voltages using the gamma reference voltages.

15. The digital-to-analog converter according to claim 14, wherein the switching block comprises:

an RGB pre-switching block configured to switch gamma voltages that correspond to lower M bits of the N-bit gamma voltage selection signals, among the RGB common gamma voltages, an R pre-switching block configured to switch gamma voltages that correspond to the lower M bits of the N-bit gamma voltage selection signals, among the R gamma voltages, a G pre-switching block configured to switch gamma voltages that correspond to the lower M bits of the N-bit gamma voltage selection signals, among the G gamma voltages, a B pre-switching block configured to switch gamma voltages that correspond to the lower M bits of the N-bit gamma voltage selection signals, among the B gamma voltages, an R switch array configured to transmit the gamma voltages outputted from the R pre-switching block connected to one terminals thereof to a post-switching block in response to the R driving signals, a G switch array configured to transmit the gamma voltages outputted from the G pre-switching block connected to one terminals thereof to the post-switching block in response to the G driving signals, a B switch array configured to switch the gamma voltages outputted from the B pre-switching block connected to one terminals thereof to the post-switching block in response to the B driving signals, and the post-switching block configured to select and output gamma voltages that correspond to bits remaining by excluding the lower M bits of the gamma voltage selection signals, among the gamma voltages outputted from the RGB pre-switching block, the gamma voltages outputted via the R switch array from the R pre-switching block, the gamma voltages outputted via the G switch array from the G pre-switching block, and the gamma voltages outputted via the B switch array from the B pre-switching block; and wherein a plurality of switches are arranged in each of the switch arrays to implement switching operation in response to a corresponding driving signal.

* * * * *